United States Patent [19]

Matsuda et al.

[11] Patent Number: 5,140,406
[45] Date of Patent: Aug. 18, 1992

[54] CRIMP-TYPE SEMICONDUCTOR DEVICE HAVING NON-ALLOY STRUCTURE

[75] Inventors: Hideo Matsuda; Takashi Fujiwara; Michiaki Hiyoshi; Hisashi Suzuki, all of Yokohama, Japan

[73] Assignee: Kabushiki Kaisha Toshiba, Kawasaki, Japan

[21] Appl. No.: 633,954

[22] Filed: Dec. 26, 1990

[30] Foreign Application Priority Data

Jan. 26, 1990 [JP] Japan ................................ 2-16496

[51] Int. Cl.⁵ ...................... H01L 23/02; H01L 23/32; H01L 23/42; H01L 29/74
[52] U.S. Cl. ......................... 357/74; 357/76; 357/79; 357/38; 357/39
[58] Field of Search ............... 357/74, 79, 76, 77, 357/38, 39

[56] References Cited

U.S. PATENT DOCUMENTS

| | | | |
|---|---|---|---|
| 4,402,004 | 8/1983 | Iwasaki | 357/74 |
| 4,996,586 | 2/1991 | Matsuda et al. | 357/74 |

FOREIGN PATENT DOCUMENTS 0064613 11/1982 European Pat. Off. .............. 357/38

OTHER PUBLICATIONS

Becke et al., "Investigations of Gate Turn-Off Structures," IEDM Technical Digest, pp. 649–653, 1980.

Primary Examiner—Rolf Hille
Assistant Examiner—Wael Fahmy
Attorney, Agent, or Firm—Finnegan, Henderson, Farabow, Garrett and Dunner

[57] ABSTRACT

A gate turn-off thyristor of the crimp and anode short-circuit type includes a semiconductor pellet having anode, cathode and gate electrodes formed on each of first and second main surfaces thereof, with the gate electrode entering into the cathode electrodes. First and second electrode members are positioned sandwiching the semiconductor pellet between them and opposing to the electrodes. First and second electrode posts are positioned sandwiching the semiconductor pellet and the electrode members between them and opposing to the electrode members. Those faces of the electrodes, electrode members and electrode posts which are opposed to one another are not fixed but contact-pressed to one another. The semiconductor pellet has at the outer rim portion thereof a region where no current flows. The outer rim of each of the electrode member and post terminates on the region through which no current flows.

13 Claims, 3 Drawing Sheets

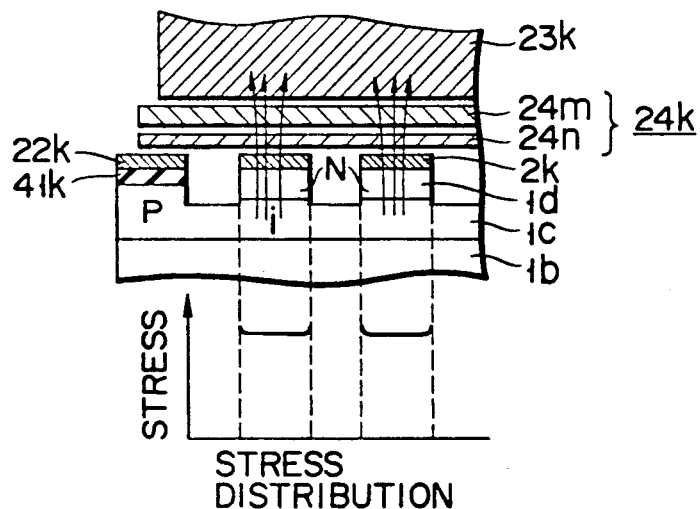
F I G. 2C

CRIMP-TYPE SEMICONDUCTOR DEVICE HAVING NON-ALLOY STRUCTURE

BACKGROUND OF THE INVENTION

1. Field of the Invention

The present invention relates to a crimp-type semiconductor device used for electric power and, more particularly, to a semiconductor device used as the gate turn-off thyristor or transistor whose heat radiation is improved and having non-alloy structure in which electrode members are not soldered to the semiconductor pellet.

2. Description of the Related Art

The structure of the common semiconductor device used for electric power employs a package of the crimp type so as to meet such conditions as heat radiation, current, capacity, explosion-proofness and matching the radius of the semiconductor pellet. One of these crimp-type semiconductor devices is disclosed in U.S. patent application Ser. No. 07/422,900 filed on Oct. 17, 1989 by H. Matsuda et al, for example.

In the case of the GTO thyristor disclosed in the U.S. Patent Application, electrodes on each of both sides of the semiconductor pellet are pressed against an electrode post through an electrode member. The semiconductor pellet is thus uniformly contact-pressed without locally receiving excessive pressing force and stress. More specifically, the outer diameter of the electrode member located on the cathode side of the pellet is made larger than that of the cathode electrode pattern which is opposed to the cathode side electrode member while the inner diameter of the former is made smaller than that of the latter. In addition, the outer diameter of the electrode member located on the anode side of the pellet is made larger than that of the anode electrode pattern which is opposed to the anode side electrode member. Further, the outer diameter of the cathode electrode post is made smaller than that of the electrode member which is opposed to the cathode electrode post. Still further, the outer diameter of the anode electrode post is made smaller than that of the electrode member which is opposed to the anode electrode post.

When the GTO thyristor having the above-described structure is excessively loaded by a particularly high operating frequency or the like at the time of its turn-off, however, positive feedback is caused at that outer rim portion of the semiconductor pellet where heat radiation is not good, in such a manner that power loss is increased to raise the temperature of the pellet and that this process is repeated to further increase the power loss and further raise the temperature of the pellet. As a result, heat break-down is caused at that region of the pellet which vertically crosses the outer rim portion of the pellet.

SUMMARY OF THE INVENTION

The object of the present invention is therefore to provide a crimp-type semiconductor device having non-alloy structure and used for electric power, wherein a semiconductor pellet and an electrode post are uniformly pressed against each other through an electrode member on each side of the pellet to keep heat radiation more excellent and prevent heat break-down from being caused by excessive load applied to the pellet at the time of its turn-off.

This object of the present invention can be achieved by a semiconductor device of the crimp type comprising a semiconductor pellet provided with main electrodes formed on first and second main surfaces thereof and also provided with a control electrode formed at least on one of the main surfaces, entering into the main electrode, first and second electrode members positioned sandwiching the semiconductor pellet between them and opposing the main electrodes, and first and second electrode posts positioned sandwiching the semiconductor pellet and the electrode members between them and opposing the electrode members, wherein those faces of the main electrodes, electrode members and electrode posts which are opposed to one another are not fixed but contact-pressed to one another, characterized in that the semiconductor pellet has at the outer rim portion thereof a region where no current flows, that the outer rim of each of the electrode members and posts terminates on the region through which no current flows, and that the outer diameter of each of the electrode members is made larger than that of each of the electrode posts.

According to a preferred aspect of the present invention, the region through which no current flows is provided on each of main surfaces of the semiconductor pellet with oxide film for insulating the semiconductor pellet from the electrode member. A layer made of the same material as that of the respective main electrode is placed on each oxide film. The top of each main electrode is on the same plane as that of the layer placed on the respective oxide film and that the face of each electrode member which is opposed to the respective top is made flat.

The present invention can be applied to the GTOs of the emitter short-circuit type, of anode short-circuit type, of reverse-blocking planar type and of double-gate type. It can be further applied to the bipolar transistor used for electric power.

According to a semiconductor device of the present invention, the whole of the main electrode regions through which current flows are contact-pressed by the electrode member and post on each of the main surfaces of the pellet to keep current density more uniform and to achieve more excellent heat radiation. Further, the outer rim of each of the electrode member and post terminates on the region where no current flows through the oxide film, and the outer diameter of the electrode member is made smaller that that of the electrode post. This enables the whole of the main electrode regions through which current flows to be uniformly contact-pressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A through 2C are intended to explain current and stress distributions at the outer circumference of a semiconductor pellet.

DETAILED DESCRIPTION OF THE PREFERRED EMBODIMENTS

Figure 1:
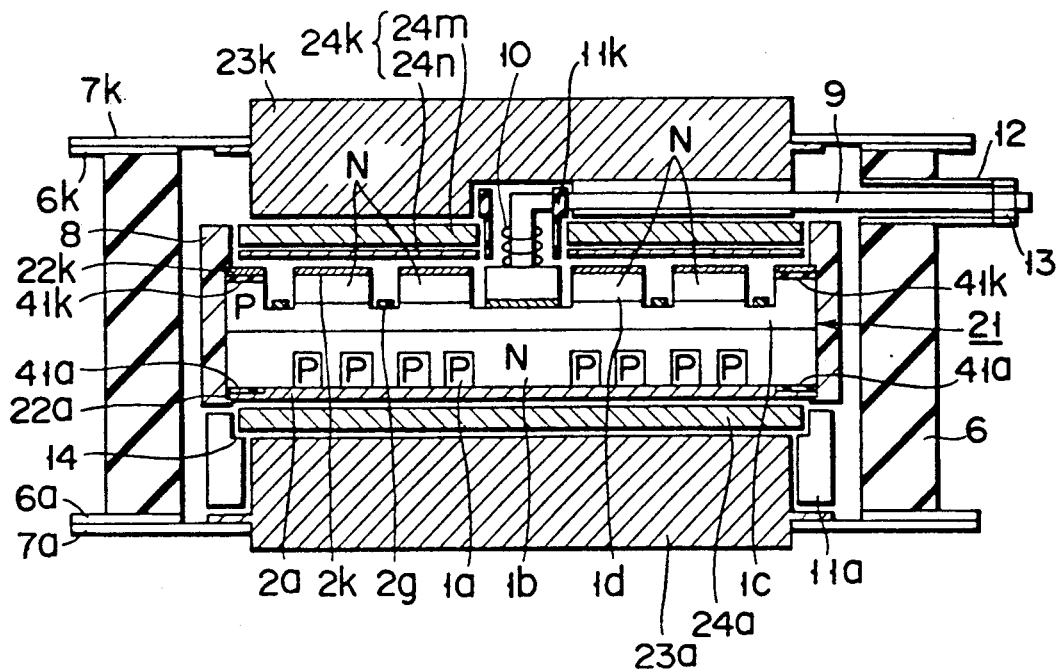
FIG. 1 is a sectional view showing a first example of the semiconductor device according to the present invention.

FIG. 1 shows a first example of the semiconductor device according to the present invention which is a GTO thyristor of the anode short-circuit type having non-alloy structure. Main members which are not fixed to but contacted with one another are shown separated from one another in FIG. 1 so as to clearly show the GTO thyristor.

In the case of this example, a semiconductor pellet 21 has a four-layer structure of a P emitter layer 1a, an N base layer 1b, a P base layer 1c and an N emitter layer 1d when they are viewed from a first main surface (or bottom in FIG. 1) of the semiconductor pellet 21 to a second main surface (or top in FIG. 1) thereof. The P emitter layer 1a is formed at selected portions on the first main surface (or on the side of the anode), while partially exposing the N base layer 1b thereon. The N emitter layer 1d is divided into a plurality of areas like islands.

Main electrodes (or cathode electrodes) 2k are formed on the N emitter layer 1d on the second main surface of the semiconductor pellet 21 and control electrode (or gate electrode) 2g is formed on the P base layer 1c. The main electrodes 2k are enclosed by the control electrodes 2g. In other words, both of these electrodes 2k and 2g are formed on the second main surface, entering into one another.

A main electrode (or anode electrode) 2a is formed on the first main surface of the semiconductor pellet 21 and the P emitter layer 1a and the partially exposed N base layer 1b are short-circuited by the main electrode 2a, thereby forming the so-called anode short-circuit structure.

The cathode electrodes 2k on the second main surface of the semiconductor pellet 21 are pressed by a cathode electrode post 23k through a cathode electrode member 24k and the anode electrode 2a on the first main surface is pressed by an anode electrode post 23a through an electrode member 24a located on the side of the anode.

The electrode member 24k located on the side of the cathode is formed by piling a hard electrode plate 24m made of Mo or W and having a thermal expansion coefficient substantially equal to that of the silicon pellet on a soft thin metal plate 24n made of Al, Ag, Cu or the like to undertake stress added to the cathode electrodes. The anode side electrode member 24a is an electrode plate made of W, Mo or the like. The main electrode, electrode members and electrode posts of the anode and cathode sides are not fixed but contact-pressed to one another, thereby forming the so-called non-alloy structure.

A bevel process is applied to the side of the semiconductor pellet 21 to keep a break-down voltage higher between the anode and the cathode and after the broken face of it is etched, it is coated by silicon resin 8 to create passivation (or insulation protection).

A gate lead 9 is arranged in hollow and cut-away portions of the electrode post and member 23k and 24k through a positioning guide 11k made of insulation material and through an insulation member (not shown). One end of the gate lead 9 is press-contacted with the gate electrode 2g by a pressing spring 10, while the other end thereof is lead outside, passing through a metal sleeve 12 soldered to the side of an insulating cylinder 6 (made of ceramics), and it is then sealed by a seal section 13. The anode side electrode member 24a and the anode electrode post 23a are positioned by a positioning guide 11a and a stepped portion 14 of this positioning guide 11a. The electrode posts 23k, 23a and the insulating cylinder 6 are silver-brazed to one another through ring-shaped metal plates (or covers) 6k, 6a, 7k and 7a, which are called weld rings, to form a package whose inside is air-tight sealed.

When gate trigger current is applied to the gate electrodes 2g while loading a forward voltage to the GTO thyristor having the above-described structure, the GTO thyristor is turned on. Namely, on-current (which is also called load current or main current) flows in from the anode electrode post 23a and out of the cathode electrode post 23k, passing through the electrode member 24a, anode electrode (or main electrode) 2a, semiconductor pellet 21, cathode electrodes (or main electrodes) 2k and electrode member 24k. This flow is substantially the same as in the case of the common SCR. The common SCR is turned from on-state to off-state while applying main current to it in the reverse direction through the commutation circuit and the like, but the GTO thyristor is turned from off-state to on-state while applying gate current to it in the reverse direction. For this purpose, the N emitter layer 1d of the GTO thyristor is so finely divided into islands as to easily become on and off and each of these islands of the N emitter layer 1d is enclosed by the gate electrode 2g.

No step is formed near the outer rim of on the cathode side (or top in FIG. 1) of the semiconductor pellet 21 and it is the same in level as the cathode electrodes 2k through which main current flows. More specifically, cathode electrodes 22k are formed on an oxide film 41k, for example, near the outer rim of the cathode side of the semiconductor pellet 21 and the cathode electrodes 2k and 22k are on the same plane. This is a feature of the semiconductor device according to the present invention. Regions where no current flows and no heat is generated are thus formed at the circumferential part of the cathode side of the semiconductor pellet 21. If necessary, an oxide film 41a may be provided at the anode side area of the semiconductor pellet 21 to form a region 22a where no current flows at the outer circumference of the anode electrode 2a.

The outer rim of each of the electrode member 24k and post 23k located on the cathode side of the pellet 21 terminates on the main electrode region 22k through which no current flows, and the outer rim of each of the electrode member 24a and post 23a located on the anode side of the pellet 21 terminates on the main electrode region 22a through which no current flows. The electrode members and posts can thus press-contact the whole of the main electrode portions on those areas of the pellet where current flows and heat is generated, thereby enabling an improved heat radiation.

In order to keep the electrode members and posts uniformly press-contacted with the whole of the main electrode portions, the outer rim of each of the electrode posts 23k and 23a is located inside the outer rim of each of the electrode members 24k and 24a and above the main electrodes 22k and 22a through which no current flows. The main electrodes 2k and 2a through which current flows can be thus kept uniformly pressed.

Figure 2A:
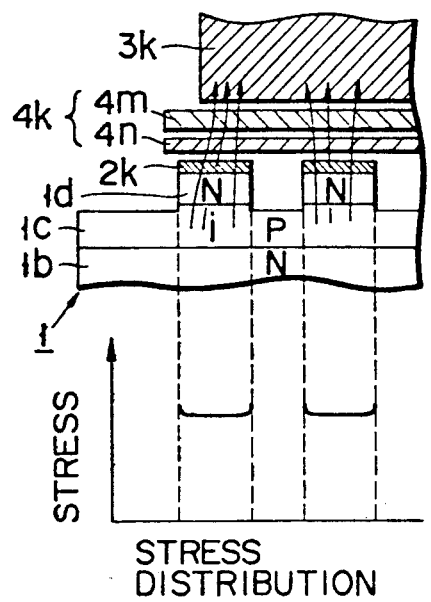
Figure 2B:
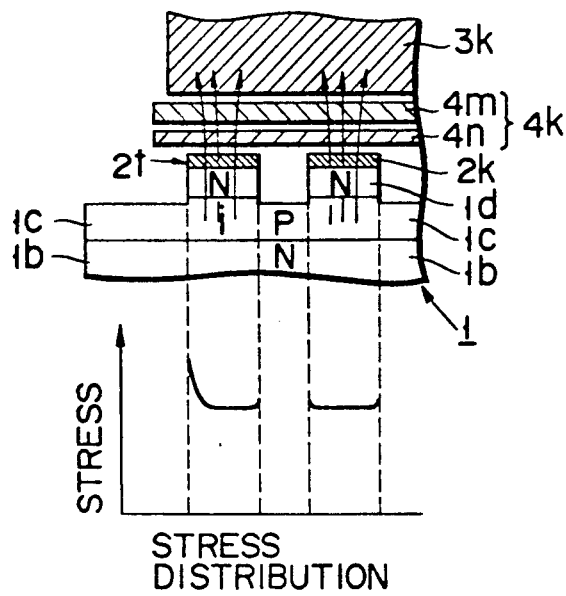

FIGS. 2A through 2C generally show current and stress distributions at outer circumferences and their vicinities of the conventional GTO thyristors and those in the case of the GTO thyristor according to the present invention shown in FIG. 1.

FIG. 2A shows the GTO thyristor disclosed in the above-cited U.S. patent application Ser. No. 07/422,900 and the same components of a semiconductor pellet 1 as those of the semiconductor pellet 21 shown in FIG. 1 will be denoted by the same reference numerals. The underside of an electrode member 4k comprising plates 4m and 4n opposes and covers the whole of those cathode electrodes 2k on the pellet 1 through which current flows. The top of the electrode member 4k covers the whole of a cathode electrode post 3k which is opposed to the top of the electrode member 4k. The electrode post 3k does not cover the whole of those cathode electrodes 2k which are opposed to the electrode post 3k and through which current flows. Namely, the outer rim of the cathode electrodes 2k is projected outside from the outer rim of the electrode post 3k. Current i (shown by arrows in FIG. 2A) thus increases its density at the outer rim portion of the cathode electrodes 2k. When excess current flows unexpectedly, therefore, heat breakdown is caused at the outer rim portion of the pellet, as described above, because of the positive feedback of heat loss and temperature. The cathode electrodes 2k receive stress uniformly on their whole surfaces in this case, as shown in FIG. 2A.

FIG. 2B shows the conventional GTO in which current density distribution is uniform at the outer rim portion of the pellet and the same components in this case as those of the pellet shown in FIG. 2A will be denoted by the same reference numerals. The outer diameter of the cathode electrode post 3k is made so larger as to cover the whole of the cathode electrodes 2k which are opposed to the post 3k and through which current flows. As shown by current arrows in FIG. 2B, the non-uniformity of the current density distribution at the outer rim portion of the pellet can be thus improved. Because the outer rim of the cathode electrode post 3k is projected outside from the outer rim of the cathode electrodes 2k, however, the end rim 2t of the outer cathode electrode 2k is subjected to strong stress and deformed by intermittent heat cycles, thereby causing short-circuit between the cathode and the gate electrodes.

FIG. 2C shows the GTO of the present invention shown in FIG. 1 and the same components as those in FIG. 1 will be represented by the same reference numerals. Outer rims of the cathode electrode member 24k and the electrode post 23k terminate on the cathode electrode 22k through which no current flows. In other words, both of the electrode member 24k and the electrode post 23k cover the whole of the cathode electrodes 2k through which current flows to thereby improve the non-uniformity of the current density distribution at the outer rim portion of the pellet 1. In addition, the outer rim of the electrode post 23k is positioned inside the outer rim of the electrode post 24k and on the cathode electrode 22k, so that the whole of the cathode electrodes 2k on that area of the pellet where current flows and heat is generated can be uniformly pressed by the electrode post 23k through the electrode post 24k.

Although the main electrode 22k or 22a through which ho current flow has been formed at the outer rim portion of the pellet with the oxide film 41k or 41a interposed between them in the above-described embodiment of the present invention, it may be arranged that none of the main electrode 22k or 22a is formed and that the oxide film 41k or 41a is instead made thicker to become the same in level as the main electrodes 2k or 2a. Other insulating films such as nitrided film may be used instead of the oxide film.

Figure 3:
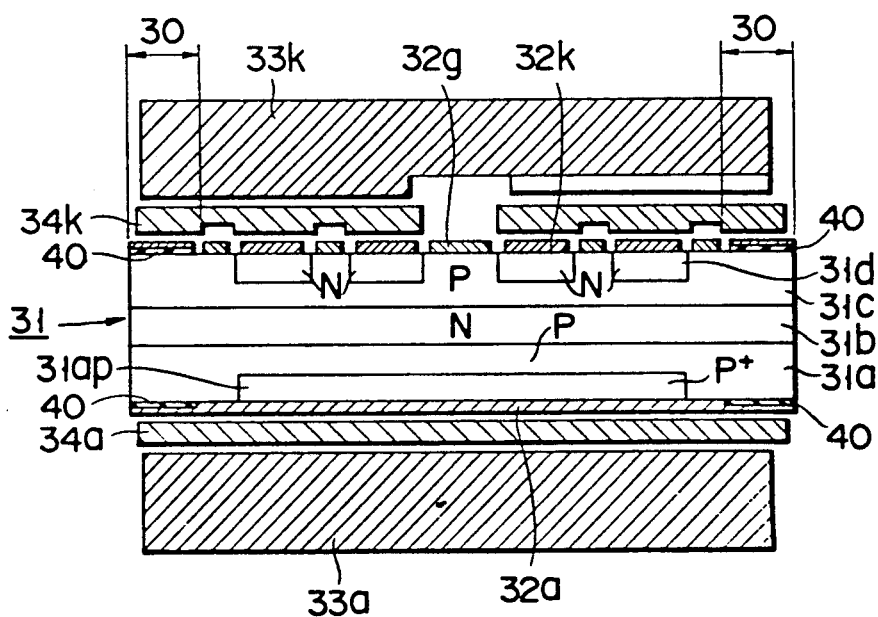
FIGS. 3 through 5 are sectional views showing second through fourth examples of the semiconductor device according to the present invention.
Figure 4:
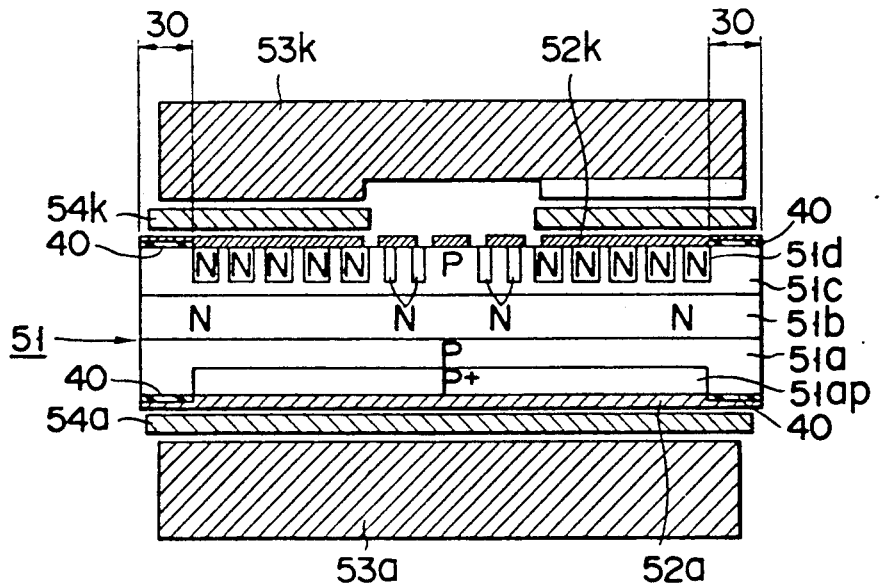
Figure 5:
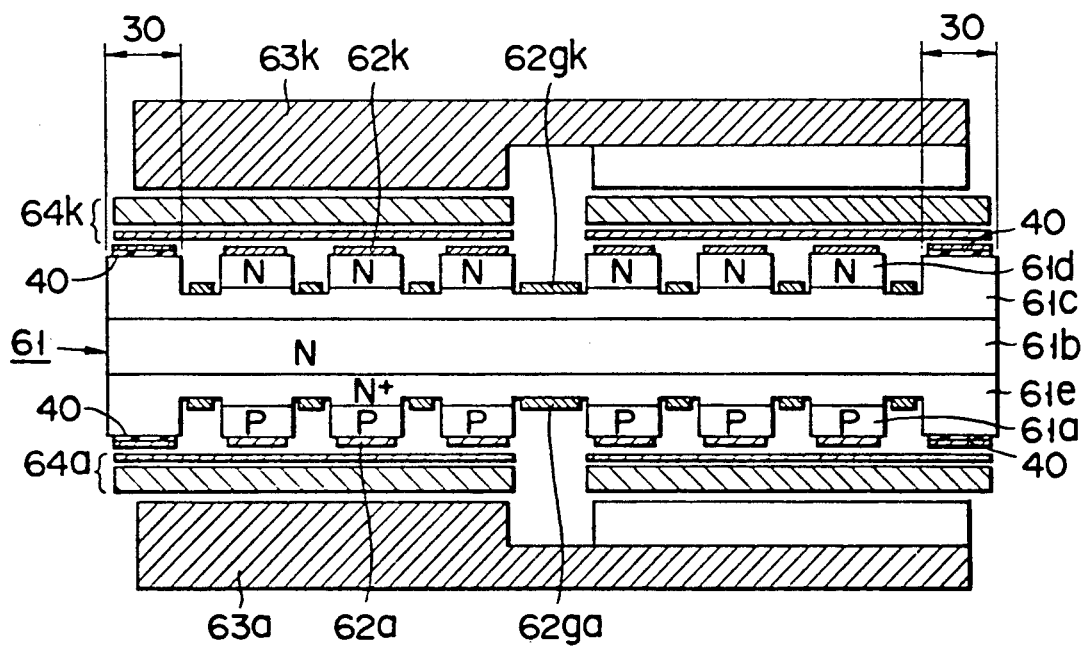

FIGS. 3 through 5 are sectional views showing main portions of second, third and fourth examples of the crimp-type semiconductor device according to the present invention, in which the package such as the insulating cylinder, the gate lead and the positioning guides are omitted for clarity. The same components as those shown in FIG. 1 will be denoted by the same reference numerals and description on these components will be omitted.

The second example shown in FIG. 3 is a GTO thyristor of the reverse-blocking planar type, which is different as follows from the first example of the GTO thyristor shown in FIG. 1.

A P base layer 31c and an N emitter layer 31d are formed planar and cathode electrodes 32k and gate electrodes 32g are formed entering into one another on the same plane on a second main surface (or cathode side) of a semiconductor pellet 31. A P emitter layer 31a is formed all over a first main surface (or anode side) of the pellet and a high density P+ emitter layer 31ap is formed at a selected portion of in the P emitter layer 31a. A main electrode is formed at the outer rim portion of each of the main surfaces of the pellet 31 with oxide film 40 interposed between them. A region 30 through which no current flows is therefore formed at the outer rim portion of each of the main surfaces of the pellet 31. An electrode member 34k located on the cathode side of the pellet has no soft thin metal plate and consists of a plate made of W (or Mo). That face of the electrode member 34k which is opposed to the cathode and gate electrodes 32k and 32g is uneven so as not to contact the gate electrodes 32g. The outer rim of each of electrode members 34k, 34a and electrode posts 33k, 33a terminates on the region 30 of the pellet 31 and the outer diameter of each of these electrode members is made larger than that of each of the electrode posts.

The third example shown in FIG. 4 is a common thyristor of the emitter short-circuit type. An N emitter layer 51d is partially formed on a second main surface (or cathode side) of a semiconductor pellet 51, a part of a P base layer 51c is exposed on the surface of the substrate, a cathode electrode 51k is made flat, and the N emitter and P base layers 51d and 51c are short-circuited to each other. A P emitter layer 51a is formed all over a first main surface (or anode side) of the pellet 51 and a high density P+ emitter layer 51ap is formed in the P emitter layer 51a. Cathode and anode electrodes 51k and 51a are provided with oxide film 40 at the outer rim portion of each of the main surfaces of the pellet 51 to thereby form there the region 30 through which no current flows. A cathode side electrode member 54k needs no soft thin metal plate and sues an electrode plate made of W or the like to directly press the cathode electrode 51k. Also in this case, the outer rim of each of the electrode members 54k, 54a and posts 53k, 53a terminates on the region 30 where no current flows, and the outer diameter of each of the electrode members is made larger than that of each of the electrode posts.

The fourth example shown in FIG. 5 is a GTO thyristor of the double-gate type. A semiconductor pellet 61 has a lamination structure comprising a plurally-divided N emitter layer 61d, a P base layer 61c, an N base layer 61b, an N buffer layer 61e and a plurally-divided P emitter layer 61a. Cathode electrodes 62k are formed on the N emitter layer 61d, anode electrodes 62a on the P emitter layer 61a, a first gate electrode 62gk on the P base layer 61c, and a second gate electrode 62ga on the N buffer layer 61e. The main and the control electrode are formed, entering into each other, on each of the first and second main surfaces of the semiconductor pellet in this case. No stepped portion is provided at the outer rim portion of each of the main surfaces of the semiconductor pellet 61, but a projection, which is the same in height as the main electrodes 62k or 62a and has the oxide film 40, is projected there to form the region 30 through which no current flows. Also in this case, the outer rim of each of the electrode members 64k, 64a and posts 63k, 63a terminates on the region 30 where no current flows, and the outer diameter of each of the electrode members is made larger than that of each of the electrode posts.

Functions and merits of these second through fourth examples according to the present invention are essentially the same as in the case of the first example.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor device of the crimp-type, comprising:
   a semiconductor pellet having a first main surface and a second main surface;
   main electrodes on the first and second main surfaces of the semiconductor pellet, each main electrode having first and second surfaces and an outer edge;
   a control electrode on at least one of the main surfaces of the semiconductor pellet, the control electrode being in electrical contact with one of the main electrodes;
   first and second electrode members positioned sandwiching the semiconductor pellet and having a first surface opposing one of the first and second surfaces of the main electrodes, a second surface and an outer edge; and
   first and second electrode posts positioned sandwiching the semiconductor pellet and the electrode members and having a surface opposing the second surface of the electrode members and an outer edge;
   wherein the opposing surfaces of the main electrodes, electrode members and electrode posts are contact-pressed to one another; and
   wherein the semiconductor pellet has a region where no current flows at an outer rim portion, the outer edge of each of the posts extends to the region through which no current flows, and the outer edge of each of the electrode members extends to the region through which no current flows.

2. The semiconductor device according to claim 1, wherein the outer edge of each of the electrode members and posts terminates on the region through which no current flows.

3. The semiconductor device according to claim 2, wherein the top of the region through which no current flows is on the same plane as that of each main electrode and the face of each electrode member which is opposed to the respective top is made flat.

4. The semiconductor device according to claim 3, wherein the region through which no current flows is provided on each of the main surfaces of the semiconductor pellet with an oxide film for insulating the electrode member from the semiconductor pellet.

5. The semiconductor device according to claim 4, wherein a layer made of the same material as the respective main electrode is on the oxide film.

6. The semiconductor device according to claim 5, wherein the top of each main electrode is the same in height as that of the layer on the oxide film and the face of the electrode member which is opposed to the top is made flat.

7. The semiconductor device according to claim 1, wherein said device is a gate turn-off thyristor of the emitter short-circuit type.

8. The semiconductor device according to claim 1, wherein said device is a gate turn-off thyristor of the anode short-circuit type.

9. The semiconductor device according to claim 1, wherein said device is a gate turn-off thyristor of the reverse-blocking planar type.

10. The semiconductor device according to claim 1, wherein said device is a gate turn-off thyristor of the double-gate type.

11. The semiconductor device according to claim 1, wherein the electrode members are circular, and the electrode posts are circular.

12. The semiconductor device according to claim 11, wherein the outer edge of each of the electrode members terminates inside of the outer edge of the region through which no current flows, and the outer edge of the posts terminates inside of the outer edge of the opposing electrode member.

13. A package for a semiconductor device of the crimp-type comprising:
   a semiconductor pellet having a first main surface and a second main surface, the semiconductor pellet having a region where no current flows at an outer rim portion of the semiconductor pellet;
   main electrodes on the first and second main surfaces of the semiconductor pellet; and
   first and second electrode members positioned sandwiching the semiconductor pellet and opposing the main electrodes, the outer edge of each of the electrode members extending to the region through which no current flows.

* * * * *